United States Patent [19]

Kuijk et al.

[11] 3,714,600

[45] Jan. 30, 1973

[54] TRANSISTOR AMPLIFIER

[75] Inventors: Karel Elbert Kuijk; Abraham Hoogendoorn, both of Emmasingel, Eindhoven, Netherlands

[73] Assignee: U.S. Philips Corporation, New York, N.Y.

[22] Filed: March 16, 1971

[21] Appl. No.: 124,828

[30] Foreign Application Priority Data

March 19, 1970 Netherlands ........................7003900

[52] U.S. Cl. ..........................330/25, 330/18, 330/19

[51] Int. Cl. ..............................H03f 3/42, H03g 3/30

[58] Field of Search ..........................330/18, 19, 22, 25

[56] References Cited

UNITED STATES PATENTS 3,089,098 5/1963 Noe ....................................330/25 X 3,487,322 12/1969 Ludlum ..................................330/22

*Primary Examiner*—Roy Lake

*Assistant Examiner*—Lawrence J. Dahl

*Attorney*—Frank R. Trifari

[57] ABSTRACT

The invention relates to a transistor amplifier in which steps have been taken to reduce the input current of the amplifier. The steps consist in the inclusion of a measuring transistor in the collector circuit of an input transistor of the amplifier and in the inclusion of a "-current mirror" between the base of the measuring transistor and the base of the input transistor. The base of the measuring transistor has been connected to the low-resistance input of the current mirror and the base of the input transistor has been connected to the high-resistance output of the current mirror.

5 Claims, 3 Drawing Figures

Figure 1A:
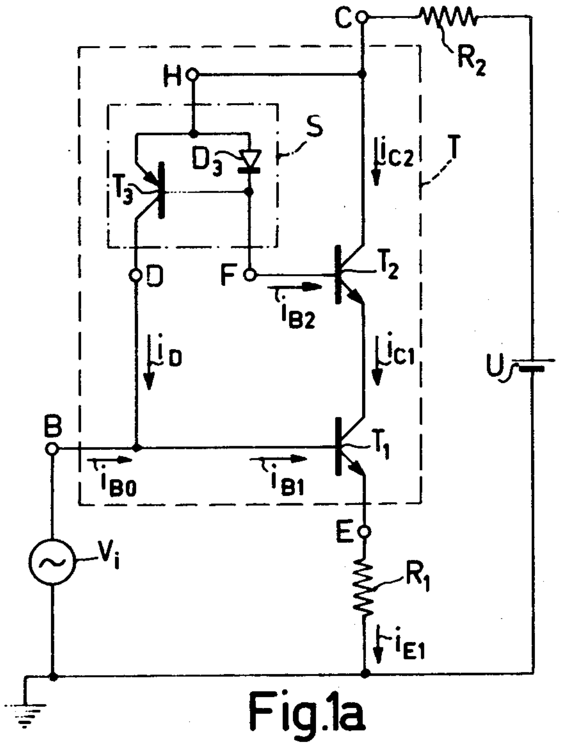

INVENTORS
KAREL E. KUIJK
ABRAHAM HOOGENDOORN
BY
AGENT

TRANSISTOR AMPLIFIER

The invention relates to a transistor amplifier which includes a first transistor to the base of which the signal to be amplified is applied. The invention relates in particular to an integrated transistor amplifier. In transistor amplifiers it is frequently desirable for the input transistors to carry a low base current in order to enable the amplifier to have a high input impedance. One of the ways in which this may be achieved is to use small emitter currents for the input transistors. However, this has the disadvantage that the steepness of the input transistors also will be small, with the result that more stages are required to obtain a given amplification factor of the amplifier. Another disadvantage consists in that the cut-off frequencies of the transistors will be small, since the cut-off frequency is approximately proportional to the emitter current. This adversely affects the frequency characteristic of the amplifier.

Further it is known that a low base current of an input transistor is obtainable by using a Darlington configuration, in which the base-emitter paths of several transistors are connected in series. In addition to the aforementioned disadvantages of reductions in cut-off frequency and in steepness the Darlington configuration when used in differential amplifiers has the disadvantage that it will give rise to an increased voltage drift. If, for example, the differential amplifier includes first, second, third and fourth transistors and the base-emitter path of the first and second transistors and also the base-emitter path of the third and fourth transistors are connected in series, with the emitters of the second and third transistors interconnected, whilst an input signal is applied between the bases of the first and fourth transistors, the overall voltage drift will be equal to the voltage drift of the first and fourth transistors increased by the voltage drift of the second and third transistors. One of the factors which determine the voltage drift of the first and fourth transistors is the drift in the base currents of the second and third transistors. Consequently, the voltage drift of the first and fourth transistors will be greater than if the first and fourth transistors were used as a single differential pair.

It is further known that a small input current is obtainable by using a field-effect transistor as the input transistor. This has the disadvantage that several amplifying stages will be required to achieve a given amplification factor of the amplifier, because in general the steepness of a field-effect transistor is small. In addition, field-effect transistors frequently show a large spread in the threshold voltages between the source and gate electrodes. As a result, the use of two field-effect transistors in an input stage of a differential amplifier will give rise to a large offset voltage of the differential amplifier. Consequently, the differential amplifier will be less suitable for use as an operational amplifier.

It is an object of the present invention to provide a solution of the aforementioned problems, and the invention is characterized in that the collector of the first transistor has been connected to a point of constant potential through the series combination of the emitter-collector path of the measuring transistor and an impedance, the base of the measuring transistor having been connected to the input of a current-controlled source of current which has a low-resistance input and a high-resistance output and from the output of which a current may be derived which is equal in value to the current supplied to the input, the input current and the output current both flowing to one terminal of the current source, whilst the high-resistance output of the current source is connected to the base of the first transistor.

Figure 1B:
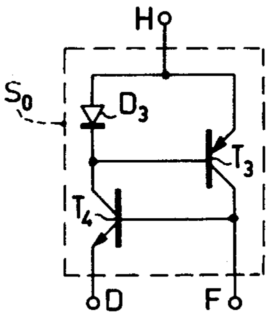
Figure 2:
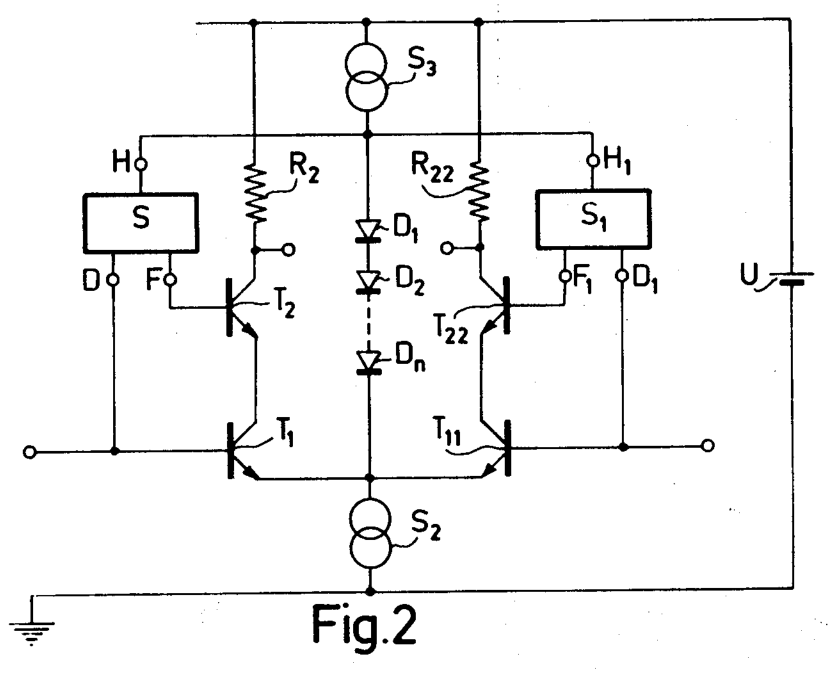

Embodiments of the invention will now be described, by way of example, with reference to the accompanying diagrammatic drawings, in which:

FIG. 1*a* is a circuit diagram of an embodiment of a transistor amplifier according to the invention, FIG. 1*b* is a circuit diagram of the controlled current source used in the transistor amplifier according to the invention, and FIG. 2 is a circuit diagram of another embodiment of a transistor amplifier according to the invention.

In the transistor amplifier shown in FIG. 1, $T_1$ is the first transistor to the base B of which the signal $V_i$ to be amplified is applied. The emitter E of the first transistor is connected to a point of constant potential through a resistor $R_1$. The collector of the transistor $T_1$ is connected to the emitter of a measuring transistor $T_2$. The collector of the measuring transistor $T_2$ is connected to a supply voltage source U through a resistor $R_2$. The base of the measuring transistor $T_2$ is connected to the current input F of a controlled current source S, and the base of the first transistor $T_1$ is connected to the current output D of the controlled current source S.

A terminal H of the current source S is connected to the collector of the measuring transistor $T_2$. The current source S comprises a transistor $T_3$ and a diode $D_3$. The emitter of the transistor $T_3$ and the anode of the diode $D_3$ are connected to the terminal H of the current source S. The collector of the transistor $T_3$ is connected to the current output D of the current source S, and the base of the transistor $T_3$ and the cathode of the diode $D_3$ are connected to the current input of the source S. The input impedance of the controlled current source S, which is equal to the impedance between points F and H of the current source, will be low, for it is equal to the resistance of the diode $D_3$ in the conductive condition thereof. The output impedance of the controlled current source S, which is equal to the impedance between points D and H of the current source, will be high, for it is equal to the output impedance of the transistor $T_3$. The operation of the transistor amplifier shown in FIG. 1*a* is as follows:

It is assumed that the base-collector current amplification factors $\alpha'$ of the two transistors $T_1$ and $T_2$ are substantially equal. This assumption may be closely approximated by integrating the two transistors $T_1$ and $T_2$ in a single semiconductor body and by giving them identical geometrical structures. If $i_{e1}$ is the emitter current of the first transistor $T_1$, we have:

$$i_{b1} = i_{c1} / \alpha' \text{ and}$$

$$i_{c1} = i_{e2},$$

where $i_{b1}$ is the base current of the first transistor $T_1$, $i_{c1}$ is the collector current of the transistor $T_1$, $i_{e2}$ is the emitter current of the measuring transistor $T_2$ and $\alpha'$ is equal to the base-collector current amplification factor of the two transistors $T_1$ and $T_2$. The base current $i_{b2}$ of the transistor $T_2$ will then be given by $$i_{b2} = (\alpha')/(\alpha'+1) \cdot i_{b1}.$$

The controlled current source S has the property that when the current flowing through the diode $D_3$ has a given value the current at the output D of the current source S will be of equal value. This will be the case if the emitter area of the transistor $T_3$ is equal to the emitter area of the diode $D_3$. This means that the current $i_D$ will be equal to the current $i_{b2}$. For the overall input current $i_{bo}$ of the amplifier shown in FIG. 1 we now have:

$$i_{bo} = i_{b1} - i_D = (i_{e1})/((\alpha'+1)^2) \ldots \quad (1)$$

From the formula (1) it follows that owing to the step according to the invention the input current of the amplifier has been reduced by a factor $(\alpha' + 1)$. The part of the amplifier which in the circuit diagram of FIG. 1*a* is enclosed by a broken line behaves as a transistor having a high base-collector current amplification factor. Of this transistor, B is the base, E the emitter and C the collector. At high frequencies the current source S drops, i.e., at high frequencies the alternating-current component of the output current $i_D$ of the current source will be substantially zero. Consequently, the alternating-current component of the input current $i_{bo}$ will be substantially equal to the alternating-current component of the base current $i_{b1}$ of the transistor $T_1$. This means that the high-frequency behavior of the amplifier shown in FIG. 1 is determined only by the cut-off frequencies of the transistors $T_1$ and $T_2$, which may be high because the emitter currents of the two transistors may be made comparatively high. In FIG. 1 the point H has been connected to the collector of the measuring transistor $T_2$, but for alternating current it may just as well be connected to the emitter of the transistor $T_1$. The latter connection has the advantage that the transistors $T_2$ and $T_1$ will then operate as a cascode circuit, ensuring a small reaction of the collector of the transistor $T_2$ to the input of the amplifier.

The controlled current source S of the amplifier shown in FIG. 1*a* may simply be replaced by the controlled current source $S_o$ shown in FIG. 1*b*. This current source $S_o$ comprises transistors $T_3$ and $T_4$ and a diode $D_3$. The emitter of the transistor $T_3$ and the anode of the diode $D_3$ have been connected to the terminal H of the current source. The base of the transistor $T_3$ and the cathode of the diode $D_3$ have been connected to the emitter of the transistor $T_4$, the base of which has been connected to the collector of the transistor $T_3$. The collector of the transistor $T_4$ has been connected to the output D of the current source $S_o$, and the collector of the transistor $T_3$ has been connected to the input F of the current source $S_o$. The advantage of the use of the current source $S_o$ instead of the current source S is that the equality of the currents at the output D and at the input F is improved and that the output impedance of the current source will be higher.

FIG. 2 shows a second embodiment of the transistor amplifier according to the invention. In this embodiment the transistor amplifier is in the form of a differential amplifier stage.

The collector of the transistor $T_1$ has been connected to the emitter of the transistor $T_2$, the base of which has been connected to the current input F of the current source S. The current output D of the current source has been connected to the base of the transistor $T_1$. The collector of the transistor $T_2$ has been connected to a direct-voltage source U through a resistor $R_2$. The collector of a transistor $T_{11}$ has been connected to the emitter of a transistor $T_{22}$, the base of which has been connected to a current input $F_1$ of a current source $S_1$. A current output $D_1$ of the current source $S_1$ has been connected to the base of the transistor $T_{11}$. The collector of the transistor $T_{22}$ has been connected to the direct-current source U through a resistor $R_{22}$. The emitters of the transistors $T_1$ and $T_{11}$ have jointly been connected to earth through a current source $S_2$. The terminals H and $H_1$ of the current sources S and $S_1$ respectively have jointly been connected to the direct-voltage source U through a current source $S_3$. The terminals H and $H_1$ have also been jointly connected to the emitters of the transistors $T_1$ and $T_{11}$ through the series combination of diodes $D_1$ to $D_n$. The input signal may be applied between the bases of the transistors $T_1$ and $T_{11}$, and the output signal may be taken between the collectors of the transistors $T_2$ and $T_{22}$. The operation of the two halves ($T_1$, $T_2$ and $T_{11}$, $T_{12}$) of the differential amplifier stage shown in FIG. 2 is entirely analogous to the operation of the transistor amplifier shown in FIG. 1. In particular if the differential amplifier stage shown in FIG. 2 has been integrated in a single semiconductor body satisfactory operation of the differential amplifier stage will be obtained, because in this case the difference in parameters of the transistors used may be a minimum. Hence the differential amplifier stage shown in FIG. 2 is highly suited for use as the input stage of a differential amplifier. The voltage drift in the differential amplifier shown in FIG. 2 will be small, since it is determined only by the transistor pair $T_1$ and $T_{11}$, and consequently the differential amplifier shown in FIG. 2 is highly suitable for use as the input stage of an operational amplifier.

What is claimed is:

1. A transistor amplifier, comprising a first transistor having a base, a collector and an emitter, the base of the first transistor comprising the input to the amplifier, means connecting the emitter of the first transistor to a constant potential, a measuring transistor having a base and a collector-emitter path, and impedance, means connecting the collector of the first transistor through a series combination of the impedance and the collector emitter path of the measuring transistor to a second constant potential different from the first constant potential, a current-controlled current source having an input terminal, an output terminal and a common terminal for providing an output current equal to the input current, the resistance between the input terminal and the common terminal being substantially smaller than the resistance between the output terminal and the common terminal, means connecting the common terminal of the current source to a constant potential, means connecting the base of the measuring transistor to the input terminal of the current source, and means connecting the output terminal of the current source to the base of the first transistor.

2. A transistor amplifier as claimed in claim 1, wherein the means connecting the common terminal of the current source to a constant potential comprises means connecting the common terminal of the current source to the collector of the measuring transistor.

3. A transistor amplifier as claimed in claim 1, wherein the current controlled current source comprises a third transistor having a base, an emitter and a collector, means connecting the emitter of the third transistor to the common terminal of the current controlled current source, means connecting the collector of the third transistor to the output terminal of the current controlled current source, means connecting the base of the third transistor to the input terminal of the current controlled current source, and a diode connected in parallel with the base and emitter of the third transistor.

4. A transistor amplifier as claimed in claim 3, further comprising a fourth transistor having a base, an emitter and a collector, means connecting the base of the fourth transistor to the collector of the third transistor, means connecting the collector of the fourth transistor to the base of the third transistor, and wherein the means connecting the base of the third transistor to the output terminal of the current source comprises the collector-emitter path of the fourth transistor.

5. An amplifier as claimed in claim 1, comprising a second stage amplifier substantially identical to the first stage amplifier, and wherein the means for connecting the emitter of the first transistor of the first state to a constant potential comprises a current source connected between the reference potential and the emitters of the first transistors in both the first and second stages of amplification.

* * * * *